United States Patent [19]

Peek et al.

[11] 4,306,222
[45] Dec. 15, 1981

[54] (B+A)-BIT D/A CONVERTER WITH B-BIT AUXILIARY D/A CONVERTER

[75] Inventors: Johannes B. H. Peek; Wolfgang F. G. Mecklenbräuker; Theodoor A. C. M. Claasen; Nicolaas Van Hurck, all of Eindhoven, Netherlands

[73] Assignee: U.S. Philips Corporation, New York, N.Y.

[21] Appl. No.: 89,072

[22] Filed: Oct. 29, 1979

[30] Foreign Application Priority Data

Nov. 30, 1978 [NL] Netherlands .................. 7811730

[51] Int. Cl.$^3$ .......................................... H03K 13/02
[52] U.S. Cl. ............................ 340/347 DA; 375/103
[58] Field of Search ............... 340/347 DA; 364/726; 375/34, 99, 103

[56] References Cited

U.S. PATENT DOCUMENTS

| | | | |
|---|---|---|---|
| 3,560,957 | 2/1971 | Miura | 340/347 DA |
| 3,893,102 | 7/1975 | Candy | 340/347 DA |
| 3,987,436 | 10/1976 | Candy | 340/347 DA |
| 4,006,475 | 2/1977 | Candy | 340/347 DA |
| 4,079,373 | 3/1978 | Brown | 340/347 DA |
| 4,131,764 | 12/1978 | Claasen | 364/726 X |

OTHER PUBLICATIONS

Ritchie, "IEEE Transactions on Communications" vol. COM-22, No. 11, Nov. 1974, pp. 1797-1806.
Oppenheim, "Digital Signal Processing", 1975, pp. 413-418.
Crochiere, "IEEE Transactions on Acoustics, Speech and Signal Processing", vol. ASSP-23, Oct. 1975, pp. 444-456.
Crochiere, "IEEE Transactions on Acoustics, Speech and Signal Processing", vol. ASSP-24, Aug. 1976, pp. 296-311.
Bellanger "IEEE Trans. on Acoustics, Speech and Signal Processing", vol. ASSP-25, Aug. 1977, pp. 344-346.

Primary Examiner—Charles D. Miller
Attorney, Agent, or Firm—Thomas A. Briody; Robert T. Mayer; James J. Cannon, Jr.

[57] ABSTRACT

A digital-to-analog converter is described for converting (b+a)-bit code words into an analog signal by means of a b-bit auxiliary digital-to-analog converter. In order to reduce the quantizing noise introduced by the indispensible quantizing of the (b+a)-bit code words for obtaining the b-bit code words these (a+b)-bit code words are applied to an integrating network which has its output connected to an amplitude-limiting device which brings the integrated signal in the signal range of the auxiliary-D/A converter. The output signal of the amplitude-limiting device is now quantized and this quantizing signal is applied to the auxiliary D/A converter which produces analog output signal samples which are applied to, possibly, an analog output filter through a cascade arrangement of an amplitude-restorer and a difference network.

The (b+a)-bit code words are assumed to occur with a frequency which is higher than the Nyquist sampling frequency associated with the analog signal represented by these (b+a)-bit code words.

9 Claims, 16 Drawing Figures

(B+A)-BIT D/A CONVERTER WITH B-BIT AUXILIARY D/A CONVERTER

A. BACKGROUND OF THE INVENTION

A(1) Field of the invention

The invention relates to a digital-to-analog converter (D/A converter for short), for converting a digital signal consisting of a sequence of code words each comprising a plurality of bits into an analog signal.

A(2). Description of the prior art

D/A converters are used in mutually very different technical fields. Generally speaking they convert a digital signal, formed by a sequence of code words each comprising a certain number of bits and occurring at a certain sampling frequency $f_s$ into a time-continuous signal. To enable this conversion each code word is converted into a signal sample whose amplitude is proportional to said code words and constant during a sampling period T which is equal to $1/f_s$. This furnishes a staircase signal which is usually also applied to a low-pass filter at the output of which the desired analog signal occurs. Embodiments of D/A converters are shown in reference 1. Many D/A converters are implemented from a plurality of resistors through which accurately defined currents flow. The number of currents required for decoding a code word is at least equal to the number of bits of which this code word consists. If these code words have been obtained by encoding a speech signal they usually do not comprise more than 12 bits. If, however, they are obtained by encoding a music signal and hi-fi quality is required after decoding then they comprise, for example, 16 bits. The more bits a code word comprises the more accurate the resistors and the currents must be and the higher the complexity and the price of such a D/A converter. This price inhibits the use of these D/A converters in, for example, audio equipment such as magnetophones, for the consumer's market.

Hereinafter a code word consisting of, for example, d bits will be denoted by "d-bit code word". In a similar manner a D/A converter arranged for decoding a d-bit code word will be denoted by "d-bit D/A converter".

B. SUMMARY OF THE INVENTION

It is an object of the invention to provide a digital-to-analog converter which can be realized in an economically justified manner.

According to the invention the digital-to-analog converter for converting a digital signal formed by a sequence of code words each comprising b+a bits into an analog signal comprises:

(a) a converter input for receiving the digital signal and a converter output;

(b) integration and amplitude-limiting means for generating a digital auxiliary signal which is an amplitude-limited version of the integrated signal applied to these means;

(c) first coupling means for coupling the input of the integration and amplitude-limiting means to the converter input;

(d) quantizing means connected to said integration and amplitude-limiting means for limiting the word length of the code words of the digital auxiliary signal for generating a quantizing means output signal formed by a sequence of code words each comprising b bits;

(e) difference and amplitude-restoration means;

(f) second coupling means for coupling the input of the difference and amplitude-restoration means to the output of the quantizing means;

(g) third coupling means for coupling the output of the difference and amplitude-restoration means to the converter output;

(h) a b-bit auxiliary digital-to-analog converter which is included in the circuit formed by the second coupling means, the difference and amplitude-restoration means and the third coupling means.

With the digital-to-analog converter according to the invention, a (b+a)-bit D/A conversion is realized using, in general, a cheaper and simpler b-bit auxiliary D/A converter. In order to obtain a signal-to-quantizing noise ratio associated with a (b+a)-bit-D/A-converter, a pre-processing operation is performed on the digital input signal before applying this signal to the quantizing means. A post-processing operation is thereafter performed on the output signal of the quantizing means. This post-processing operation shifts the quantizing noise signal introduced by the quantizing means to such a frequency band that it can be suppressed by a filter circuit. The pre-processing circuit has for its object to realize said suppression of the noise signal without affecting the desired signal.

C. SHORT DESCRIPTION OF THE FIGURES

D. REFERENCES

1. Special Issue on Analog/Digital Conversion; IEEE Transactions on circuits and systems, Vol. CAS-25, No. 7, July 1978.
2. Digital Signal Processing; A. V. Oppenheim, R. W. Schafer; Prentice-Hall 1975, pages 413–418;
3. Dutch Patent Application No. 7703633, corresponding to U.S. Pat. No. 4,131,764;
4. Optimum FIR Digital Filter Implementations for Decimation, Interpolation and Narrow Band Filtering; L. R. Rabiner, R. E. Crochiere; IEEE Transactions on Acoustics Speech and Signal Processing, Vol. ASSP-23, October 1975, pages 444–456;
5. Further Considerations on the Design of Decimators and Interpolators; R. E. Crochiere, L. R. Rabiner; IEEE Transactions on Acoustics, Speech and Signal Processing, Vol. ASSP-24, August 1976, pages 296–311;
6. Computation Rate and Storage Estimation in Multirate Digital Filtering with Half-Band Filters; M. G. Bellanger; IEEE Transactions on Acoustics, Speech and Signal Processing, Vol. ASSP-25, August 1977, pages 344–346.

E. DESCRIPTION OF THE EMBODIMENTS

E(1). Introduction

E(1.1) The power spectrum of a digital signal

A digital signal is a time and amplitude-discrete signal. Such a signal is, for example, obtained by sampling an analog signal $\tilde{x}_a(t)$ at instants nT, resulting in signal samples which will be denoted by $x_a(nT)$, by quantizing the signal samples thus obtained resulting in quantized signal samples $x_a(nT)$ and by converting them into a multi-bit number, called code-word hereinafter and denoted by $x(n)$. Herein n represents an integer located in the interval $-\infty < n < \infty$ and T represents the sampling period. The said digital signal is now formed by the sequence of code words $x(n)$ and this signal will be denoted by $\{x(n)\}$. The quantity $1/T$ is sometimes called sampling frequency and will be denoted by $f_s$.

If it is now assumed that each of the code words $x(n)$ comprises $b+a$ bits, these bits being indicated by $c_i(n)$, where $i = 0, 1, 2, \ldots b+a-1$, respectively, and which are either equal to 1 or to 0 then it holds that $$x_a(nT) = x(n) \cdot V_{max}$$

or $$\tilde{x}_a(nT) = V_{max}(-1)^{C_0(n)} \sum_{i=1}^{b+a-1} C_i(n) 2^{-i} \qquad (1)$$

In (1), $V_{max}$ represents the upper limit of the amplitude of the analog signal $x_a(t)$ so that it holds for $x_a(t)$ that:

$$-V_{max} < x_a(t) < V_{max} \qquad (2)$$

Figure 1:
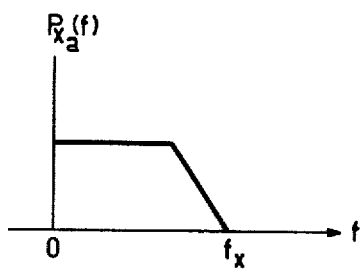
FIG. 1 shows schematically the power spectrum of an analog signal.
Figure 2:
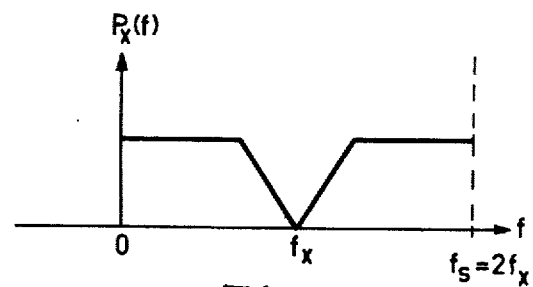
FIG. 2 shows also schematically one period of the power spectrum of a digital signal having associated therewith a sampling frequency which is equal to the Nyquist frequency.

In the preceding it was described that to enable the conversion of the analog signal $x_a(t)$ into the sequence of code-words $x(n)$, this analog signal $x_a(t)$ must first be sampled at a rate $f_s$. If now the frequency spectrum of $x_a(t)$ differs from zero only at the frequency-interval $0 \leq f \leq f_x$ then $f_s$ must be at least $2f_x$. By way of illustration FIG. 1 shows schematically the power spectrum $P_{x_a}(f)$ of $x_a(t)$ and FIG. 2 shows, also schematically, one period of the power spectrum $P_x(f)$ of the digital signal $\{x(n)\}$.

It is now useful to investigate how the power spectrum looks like of a digital signal $\{z(n)\}$ obtained by reducing the word length of each of the code-words $x(n)$ to b bits, for example, by rounding. To effect this a non-linear quantizing operation $Q[.]$ must be performed on each of the code words $x(n)$ thus that $z(n)$ can be written as $$z(n) = Q[x(n)] \qquad (3)$$

This quantizing operation can also be described in a different manner, it namely also holds that $$z(n) = x(n) + e(n) \qquad (4)$$

In this expression $e(n)$ represents the quantizing error, it holding for this error that:

$$-2^{-b-1} < e(n) < 2^{-b-1} \qquad (5)$$

These quantizing errors may be considered as being code-words of a digital noise signal $\{e(n)\}$ having a power density spectrum which is uniformly distributed of a frequency interval $0 \leq f \leq f_s$. Consequently, this noise signal may be considered as "white noise" (see reference 2). If the total noise power of this noise signal is denoted by $P_e$ then it holds that $$P_e = 2^{-2b}/12 \qquad (6)$$

Figure 3:
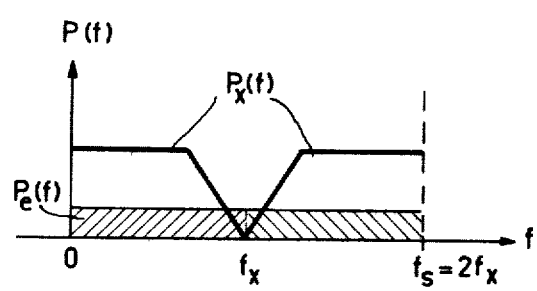
FIG. 3 shows one period of the power spectrum of a digital signal and the noise signal power spectrum introduced by amplitude-quantization.

This noise power will now distribute itself uniformly over the frequency interval $0 \leq f \leq f_s$. FIG. 3 shows all this for one period of the power spectrum of the signal $\{z(n)\}$.

As FIG. 3 shows not only the original signal having the power spectrum $P_x(f)$ but also a noise signal having a power spectrum $P_e(f)$ for which it holds that:

$$P_e(f) = P_e \cdot T \qquad (7)$$

is present in the frequency interval $0 \leq f \leq 2f_x$.

E(1.2) Sampling frequency and quantizing noise

In paragraph E(1.1) it is described that, if the word length of each of the code-words $x(n)$ is reduced from $b+a$ bits to b bits a noise signal is then introduced having the power density spectrum $P_e(f)$. As mentioned hereinbefore it holds that: $T = 1/f_s$. In other words, $P_e(f)$ is directly proportional to the sampling period T or inversely proportional to the sampling frequency. This means that if we would be able to increase the sampling frequency $f_s = 2f_x$ which is associated with $\{x(n)\}'$ by a factor of N, so that a digital signal $\{x'(n)\}$ is obtained with which a sampling frequency $f'_s = Nf_s$ is associated, the power density spectrum $P'_e(f)$ of the digital noise signal $\{e(n)\}$, obtained by quantizing each code-word $x'(n)$ in the above described manner, would be given by $$P'_e(f) = P_e \cdot T' = P_e T/N \qquad (8)$$

The above-mentioned increase of the sampling frequency by a factor of N can now be achieved by means of an arrangement which inserts each time N code words having the value zero between two consecutive code-words $x(n)$ and $x(n-1)$ and, possibly, a digital filter in cascade therewith. Such an arrangement is described in reference 3 where it is called SRI element. A digital low-pass filter can be used as the digital filter. The cascade arrangement of this SRI element and this digital filter is sometimes called interpolator, it will be denoted by means of the symbol shown in FIG. 4. In this symbol N represents the increase factor. References 4, 5 and 6 describe embodiments of such an interpolator.

Figure 4:
FIG. 4 shows the symbol for an interpolator.
Figure 5:
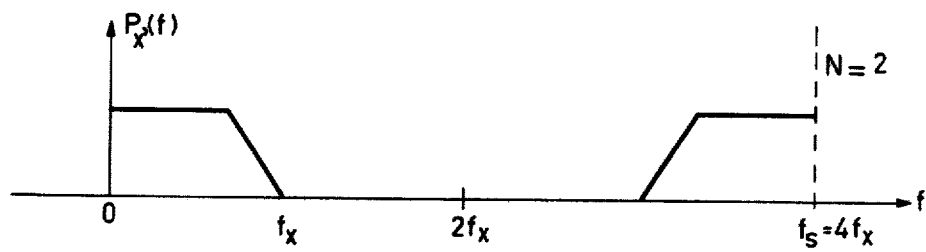
FIG. 5 shows schematically one period of the power spectrum of the output signal of the interpolator shown in FIG. 4 if a signal having the power spectrum shown in FIG. 2 is applied thereto.
Figure 6:
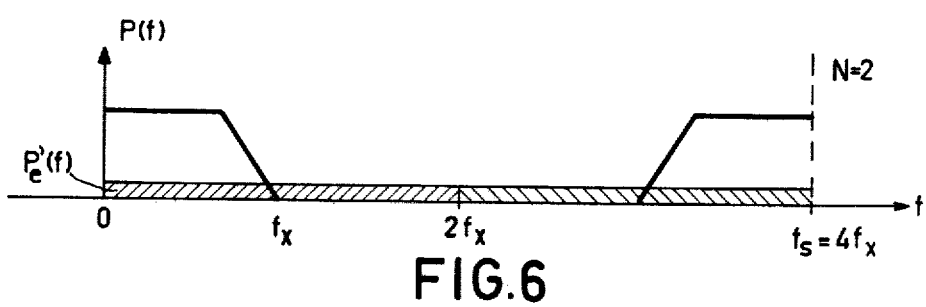
FIG. 6 shows one period of the power spectrum of a digital signal with which a sampling frequency is associated which is N=2 times higher than the Nyquist frequency, as well as the noise signal power spectrum introduced by amplitude quantization.

If now more particularly the digital signal $\{x(n)\}$ having the power spectrum shown in FIG. 2 is applied to the interpolator shown in FIG. 4 then this interpolator produces a digital signal $\{x'(n)\}$ having a power spectrum $P_{x'}(f)$ the shape of which for $N=2$ is schematically shown in FIG. 5. If this digital signal $\{x'(n)\}$ is now subjected to the quantizing operation mentioned in paragraph E(1.1) then a digital signal is obtained having a power spectrum schematically shown in FIG. 6. Of the noise signal introduced by this quantizing operation the frequency component located in the frequency interval $f_x \leq f \leq (2N-1)f_x$ can now be suppressed by means of a digital low-pass filter, so that a noise signal is left having a total power equal to $P_e/N$.

E(2) The arrangement according to the invention

Figure 7:
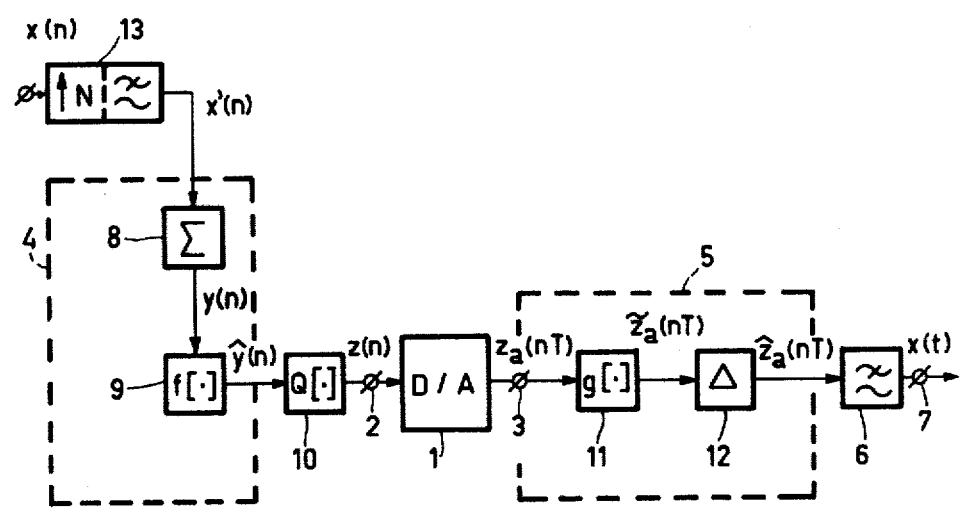
FIG. 7 shows schematically the general set-up of the digital-to-analog converter according to the invention.

This paragraph describes and explains the general set-up of a digital-to-analog converter, shown in FIG. 7, for converting a digital signal $\{x(n)\}$ formed by a sequence of $(b+a)$-bit code-words $x(n)$ into an analog signal $x(t)$ with the use of a b-bit auxiliary-digital-to-analog converter which is considerably cheaper than a $(b+a)$-bit-D/A-converter.

The D/A converter shown in FIG. 7 comprises a b-bit auxiliary D/A converter 1 which is implemented in a conventional manner. This auxiliary D/A converter 1 comprises a digital signal input 1 and an analog signal output 3. If a digital signal $\{z(n)\}$ is applied to this auxiliary D/A converter, this converter produces signal samples $z_a(nT)$ for which it holds that $$z_a(nT) = z(n)V_{max} + e'(n)V_{max} \qquad (9)$$

In (9) $e'(n)V_{max}$ represents a sample of an amplitude-limited error signal occurring from inaccuracies in the auxiliary D/A converter.

The input 2 of this auxiliary D/A converter is connected through a quantizing device 10 to the output of a pre-processing device 4 to which a digital signal $\{x'(n)\}$ consisting of the $(b+a)$-bit code-words $x'(n)$ is applied. It will be assumed that this digital signal $\{x'(n)\}$ occurs at the output of the interpolator 13 to which a digital signal $\{x(n)\}$ is applied with which a sampling frequency $2f_x$ is associated and has the power spectrum schematically shown in FIG. 2. A sampling frequency $2Nf_x$ is thus associated with $\{x'(n)\}$ and this digital signal has the power spectrum shown in FIG. 5 for $N=2$.

The output of the auxiliary D/A converter is connected to the input of a post-processing device 5 which has its output connected to the input of a low-pass filter 6 which applies the desired analog signal $x(t)$ to its output 7.

The pre-processing device 4 comprises an integrating network 8 and an amplitude-limiting device 9 having a limiting function $f[.]$. The integrating network 8 can be in the form of an accumulator and produces, in response to the code-words $x'(n)$ applied thereto, the code-words $y(n)$ for which it holds that:

$$y(n) = \sum_{i=-\infty}^{n} x'(i) \qquad (10)$$

These code-words are applied to the amplitude-limiting device 9 which produces the code-words $\hat{y}(n)$ for which it holds that:

$$\hat{y}(n) = f[y(n)] \qquad (11)$$

These code-words $\hat{y}(n)$, consisting of $b+a$ bits are now applied to the quantizing device which, in response thereto, produces the b-bit code-words $z(n)$ with $$z(n) = \hat{y}(n) + e(n) \qquad (12)$$

This quantizing device 10 can be implemented so that it applies the b most significant bits of $\hat{y}(n)$ to the b-bit-auxiliary D/A converter 1. If $y(n)$ is given in 2-complement, this form of quantizing is known as "value truncation" (see reference 2).

The post-processing device 5 comprises an amplitude restoration device 11 and a difference network 12. The amplitude-restoration device 11 has an amplitude-restoration function $g[.]$ and, in response to the signal samples $z_a(nT)$ applied thereto, it produces the signal samples $\tilde{z}_a(nT)$ for which it holds that $$\tilde{z}_a(nT) = g[z_a(nT)] = g[y(n)V_{max} + \{e(n) + e'(n)\}V_{max}] \qquad (13)$$

For an accurate restoration of the amplitude it must hold that $g[.]$ is inverse to $f[.]$. Generally speaking this means for a variable $\alpha$ that:

$$\alpha = g[f[\alpha]] \qquad (14)$$

(13) can now be written:

$$\tilde{z}_a(nT) = g[f[y(n)V_{max}]] + r(nT) \qquad (15)$$

so that $$\tilde{z}_a(nT) = y(n)V_{max} + r(nT) \qquad (16)$$

These signal samples $\tilde{z}_a(nT)$ are now applied to the difference network 12, which is assumed to be of the first order. This difference network 12 produces the output signal samples $\hat{z}_a(nT)$ for which it holds that $$\hat{z}_a(nT) = \tilde{z}_a(nT) - \tilde{z}_a[(n-1)T] \qquad (17)$$

so that $$\hat{z}_a(nT) = y(n)V_{max} - y(n-1)V_{max} + r(nT) - r[(n-1)T]$$

With (10) it follows therefrom that $$\hat{z}_a(nT) = x'(n)V_{max} + r(nT) - r[(n-1)T] \qquad (18)$$

If now the cut-off frequency of the low-pass filter is taken equal to $1/(2NT)$, the analog signal $x(t)$ can be obtained from the signal samples $\hat{z}_a(nT)$. If this low-pass filter is assumed to be an ideal filter then it holds more particularly that:

$$x(t) = \sum_{n=-\infty}^{\infty} \hat{z}_a(nT) \frac{\sin(2\pi Nf_x t - n\pi)}{2\pi Nf_x t - n\pi} \qquad (19)$$

The noise signal r(n) present in the signal $\tilde{z}_a(nT)$ and produced by, inter alia, quantizing device 10 has a power spectrum which will be denoted by $P_r(f)$ and which has a constant value. The use of a difference network 12 so affects this power spectrum that the noise power is shifted to the frequency interval $f_x < f < (2N-1)f_x$. This can be explained as follows. If the noise signal in $\tilde{z}_a(nT)$ is represented by s(nT), then it holds in accordance with (18) that:

$$s(nT) = r(nT) - r[(n-1)T] \tag{20}$$

If now the power spectrum of s(nT) is represented by $P_s(f)$ then it can be derived that:

$$P_s(f) = 4P_r(f)\sin^2(2\pi fT/2) \tag{21}$$

Figure 8:
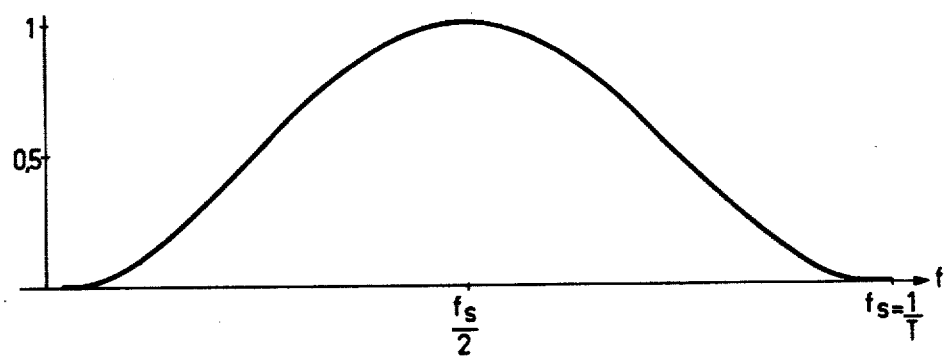
FIG. 8 shows the variation of the function $\sin^2(2\pi fT/2)$ occurring in expression (21)

FIG. 8 shows the variation of the function $\sin^2(2\pi fT/2)$ as a function of f. As $P_r(f)$ is finite for all values of f, it appears from FIG. 8 that the introduced noise signal r(n), which has a power density which is uniform of the entire frequency band $0 \leq f \leq f_s$, is suppressed in so far as it is located in the frequency intervals $0 \leq f < f_x$ and $(2N-1)f_x \leq f \leq 2Nf_x$, so that the total noise power produced at the output of the ideal low-pass filter 6 and which will be indicated by $P_s$ is given by the expression:

$$P_s = 2 \int_0^{1/(2NT)} 4P_r(f)\sin^2(2\pi fT/2)df \tag{22}$$

$$P_s = \frac{2P_r(f)}{\pi T}\left(\frac{\pi}{N} - \sin\frac{\pi}{N}\right) \tag{24}$$

If it is now a requirement for $P_s$ to be below a certain threshold value the value of N follows from (24).

E(3) The amplitude-limiting and restoration function

Only one special requirement was imposed in the foregoing on the amplitude-limiting function. Namely, this function is assumed to be invertable because otherwise no amplitude-restoration function can be found. That, however, not every invertable function can be used as amplitude-limiting function may appear from the following examples. Assuming that:

$$f[.] = \arctan[.] \tag{25}$$

With (25) (10) changes into:

$$\hat{y}(n) = \arctan y(n) \tag{26}$$

For an accurate restoration of the amplitude it must now hold that:

$$g[.] = \tan[.] \tag{27}$$

With (27) (13) changes into:

$$\tilde{z}_a(nT) = \tan[\{\hat{y}(n) + e(n) + e'(N)\}V_{max}] \tag{28}$$

From (26) and (28) it follows that if $e(n) + e'(n) = 0$ it indeed holds, as intended, that:

$$z_a(n) = \tan[\arctan[y(n)]] = y(n) \tag{29}$$

As, however, $e(n) + e'(n)$ is unequal to zero, this relationship is seriously disturbed.

A very advantageous amplitude-limiting function is obtained by periodically repeating a function which is defined in a certain interval and varies monotously in this interval and which is invertable. That interval and, consequently, also said period must be chosen suitably. Hereinafter this period will be denoted by R. A possible amplitude-limiting function is now given by $$f[y(n)] = \hat{y}(n) = F[\eta\{y(n) - k_n R\}] \tag{30}$$

In (30) $k_n$ represents an integral and positive number and indicates the ordinal number of the interval, having a length R wherein y(n) is located. The value of R must now be chosen so that the relation:

$$-1 < \hat{y}(n) < +1 \tag{31}$$

is satisfied.

As the signal samples $\tilde{z}_a(nT)$ produced at the output of the amplitude-restoration device 11 must satisfy (16), it can be derived that it must hold for the amplitude-restoration function that $$g[z_a(nT)] = (1/\eta)G[z_a(nT)] + k_n RV_{max} = \tilde{z}_a(nT) \tag{32}$$

where with:

$$G[F[\xi]] = \xi$$

By assuming that $$1/\eta = G[z_a(nT)] = z'_a(nT)$$

(32) change into $$\tilde{z}_a(nT) = z'_a(nT) + k_n RV_{max}$$

Herewith it follows, in the general sense from (17) that $$\tilde{z}_a(nT) = z'_a(nT) - z'_a[(n-1)T] + (k_n - k_{n-1})RV_{max} \tag{33}$$

Since the amplitude of each of the code-words x(n) and x'(n) is limited, the amplitude of each signal sample $\tilde{z}_a(nT)$ is also limited, in accordance with (18). This means that although $k_n$ and $k_{n-1}$ are in principle unlimited the difference $k_n - k_{n-1}$ represents a finite number.

As furthermore $\tilde{z}_a(nT)$ can never exceed $V_{max}$ it holds, if the period R is chosen greater than or equal to 2, that then:

$$\begin{aligned}
\text{either} \quad & k_n - k_{n-1} = 0 \\
\text{or} \quad & k_n - k_{n-1} = -1 \\
\text{or} \quad & k_n - k_{n-1} = +1
\end{aligned} \tag{34}$$

As indicated in (34), $k_n - k_{n-1}$ can assume one out of three possible values. This is related with the fact that y(n) can be both greater and smaller than y(n-31 1). Should, however, x(n) always be positive, then y(n) would increase monotously. In that case $k_n - k_{n-1}$ can only be 0 or +1. Starting from the assumption that:

$$0 < x'(n) < 2 \tag{35}$$

and that $R > 2$ then it holds that:

$$\begin{aligned}
&\text{if: } \hat{y}(n) > \hat{y}(n-1) \text{ then } k_n - k_{n-1} = 0 \\
&\text{if: } \hat{y}(n) < \hat{y}(n-1) \text{ then } k_n - k_{n-1} = +1
\end{aligned} \tag{36}$$

In addition the foregoing means that $\hat{z}_a(nT)$ can be fully determined from the difference $z'_a(nT)-z'_a[(n-1)T]$. If, namely, $$z'_a(nT)-z'_a[(n-1)T]>0$$

then $$k_n-k_{n-1}=0 \qquad (37)$$

and $$\hat{z}_a(nT)=z'_a(nT)-z'_a[(n-1)T]$$

If, on the contrary:

$$z'_a(nT)-z'_a[(n-1)T]<0$$

then $$k_n-k_{n-1}=+1 \qquad (38)$$

and $$\hat{z}_a(nT)=z'_a(nT)-z'_a[(n-1)T]+2V_{max}$$

E(4) Special embodiments

Figure 9:
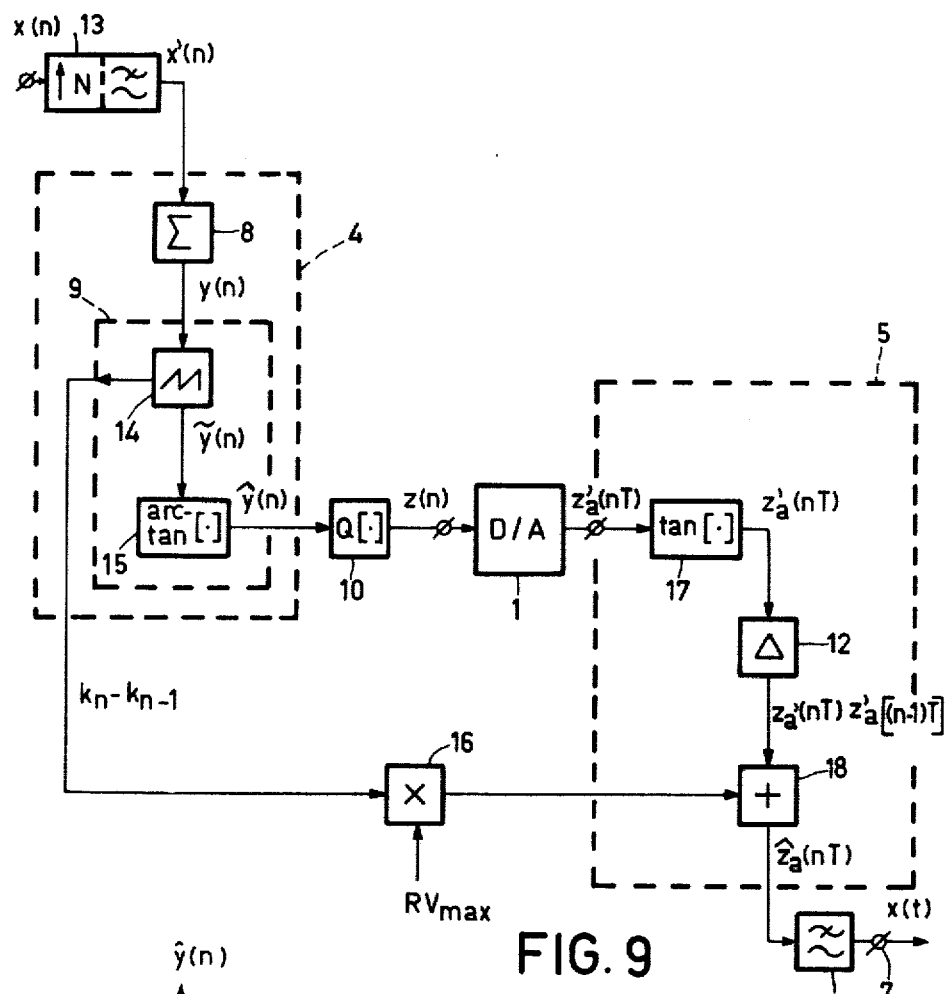
FIG. 9 shows a variant of the digital-to-analog converter shown in FIG. 7.

FIG. 9 shows schematically a modification of the arrangement shown in FIG. 7, the modification being obtained by choosing the amplitude-limiting function, defined in expression (30), in accordance with the expression:

$$f[y(n)]=\hat{y}(n)=\arctan[y(n)-k_nR] \qquad (39)$$

For the amplitude-restoration function indicated in expression (32) it must now hold that:

$$g[z_a(nT)]=\bar{z}_a(nT)=\tan\,[z_a(nT)]+k_nRV_{max} \qquad (40)$$

It should be noted that the constant $\eta$ in the expressions (30) and (32) is chosen equal to unity. For the period R a value must now be chosen so that (31) is satisfied, so that it must hold that:

$$-\tan\,1\leq y(n)-k_nR\leq+\tan\,1 \qquad (41)$$

This is satisfied by $$R=3 \qquad (42)$$

Figure 10:
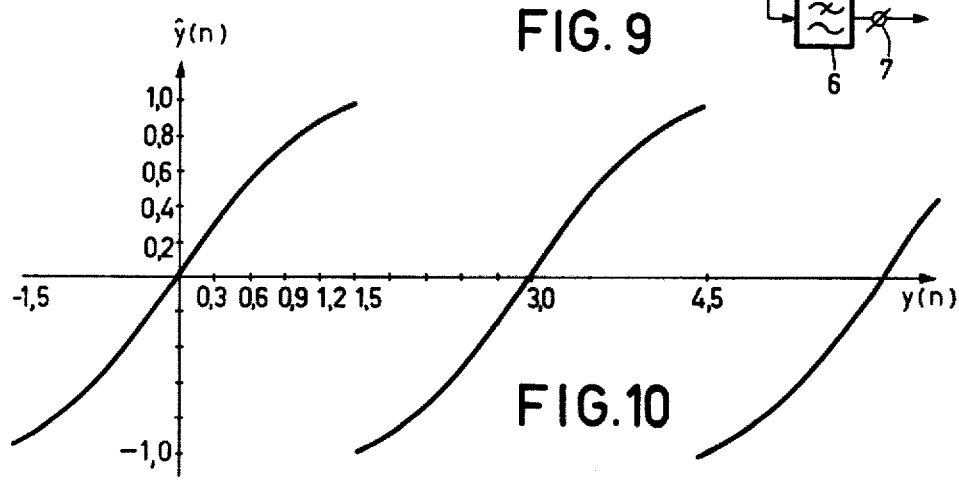
FIG. 10 shows graphically the variation of a periodical amplitude-limiting function which is non-linear in each period.

The relationship defined in expression (39) between $\hat{y}(n)$ and $y(n)$ is graphically shown in FIG. 10, the period R having been taken in accordance with (42).

From (33) and (40) it now follows that:

$$\hat{z}_a(nT)=\tan\,[z_a(nT)]-\tan\,[z_a[(n-1)T]]+k_n-k_{n-1})3V_{max} \qquad (43)$$

Because R exceeds 2, expression (34) holds for $k_n-k_{n-1}$.

The arrangement shown in FIG. 9 is implemented to a very great extent in the same manner as the arrangement shown in FIG. 7. In this FIG. 9 elements corresponding to those in FIG. 7 have been given the same reference numerals as in FIG. 7.

As shown in FIG. 9 the amplitude-limiting device 9 is now formed by a cascade arrangement of two auxiliary limiters 14 and 15. The auxiliary limiter 14 produces a digital residual signal $\{\bar{y}(n)\}$ as well as the digital number $k_n-k_{n-1}$. For the relationship between the input signal $\{y(n)\}$ and the output signal $\{\bar{y}(n)\}$ of the auxiliary limiter 14 it holds that:

$$\bar{y}(n)=y(n)-k_nR=y(n)-3k_n \qquad (44)$$

This signal $\{\bar{y}(n)\}$ is now applied to the auxiliary limiter 15 which produces the signal $\{\hat{y}(n)\}$ for which it holds that:

$$\hat{y}(n)=\arctan\,\bar{y}(n) \qquad (45)$$

The number $k_n-k_{n-1}$ produced by the auxiliary limiter 14 is applied to a signal source circuit 16 to which also a reference signal $RV_{max}$ is applied and which produces an output signal the value of which is equal to $(k_n-k_{n-1})RV_{max}$.

For the generation of the signal samples $\hat{z}_a(nT)$ defined in expression (43) the amplitude restoration device 11 is now formed by a cascade arrangement of an auxiliary restorer 17 and an adding device 18. The difference network 12 is now arranged between the output of the auxiliary restorer 17 and the input of the adding device 18. The signal samples $z_a(nT)$ produced by the auxiliary-D/A-converter 1 are now applied to the auxiliary restorer 17, which in response thereto produces the signal samples $z'_a(nT)$ for which it holds that:

$$z'_a(nT)=\tan\,z_a(nT) \qquad (46)$$

These signal samples $z'_a(nT)$ are now applied to the difference network 12 which in response thereto produces signal samples of the shape $z'_a(nT)-z'_a[(n-1)T]$ which are applied to the adding device 18 to which also the signal value $(k_n-k_{n-1})RV_{max}$ is applied. So the signal samples $\hat{z}_a(nT)$ defined in (43) are produced at the output of this adding device and again applied to the low-pass filter 6.

In the embodiment shown in FIG. 9, the amplitude-limiting device 9 is formed by two auxiliary limiters 14 and 15 and the amplitude-restoration device by an auxiliary restorer 17 and an adding device 18. It is indeed possible to realize the auxiliary limiter 14 in a simple and economic manner (see paragraph E(5)), but implementing the auxiliary limiter 15 and the auxiliary restorer 17 is not always simple and economically feasible. However, this auxiliary limiter 15 and auxiliary restorer 17 can each be formed by means of a direct through-connection; namely if the amplitude-limiting function defined by the expression (30) is given by:

$$f[y(n)]=\hat{y}(n)=\eta\{y(n)-k_nR\} \qquad (47)$$

For $\eta=1$ R can be chosen equal to 2 so that:

$$\hat{y}(n)=\bar{y}(n)=y(n)-2k_n \qquad (48)$$

Figure 11:
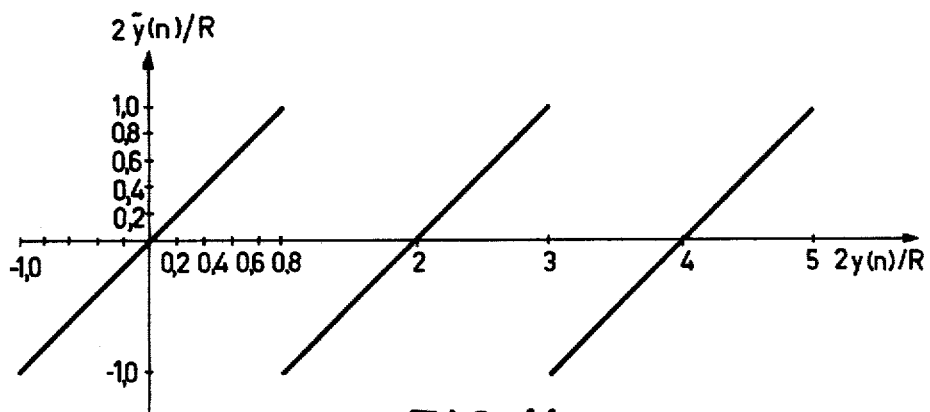
FIG. 11 shows graphically the variation of a periodical amplitude-limiting function which is linear in each period.

The relationship between $\hat{y}(n)$ and $y(n)$, given in (48) is shown graphically in FIG. 11. As expression (48) is of the same form as expression (44), FIG. 11 shows more generally the relationship between $\bar{y}(n)/(R/2)$ and $y(n)/(R/2)$ by means of a graph.

Associated with the amplitude-limiting function as defined in (48) is, in accordance with (32), an amplitude-restoration function which must be defined as follows:

$$g[z_a(nT)]=\bar{z}_a(nT)=z_a(nT)+2k_nV_{max} \qquad (49)$$

so that:

$$\hat{z}_a(nT) = z_a(nT) - z_a[(n-1)T] + 2(k_n - k_{n-1})V_{max} \quad (50)$$

Figure 12:
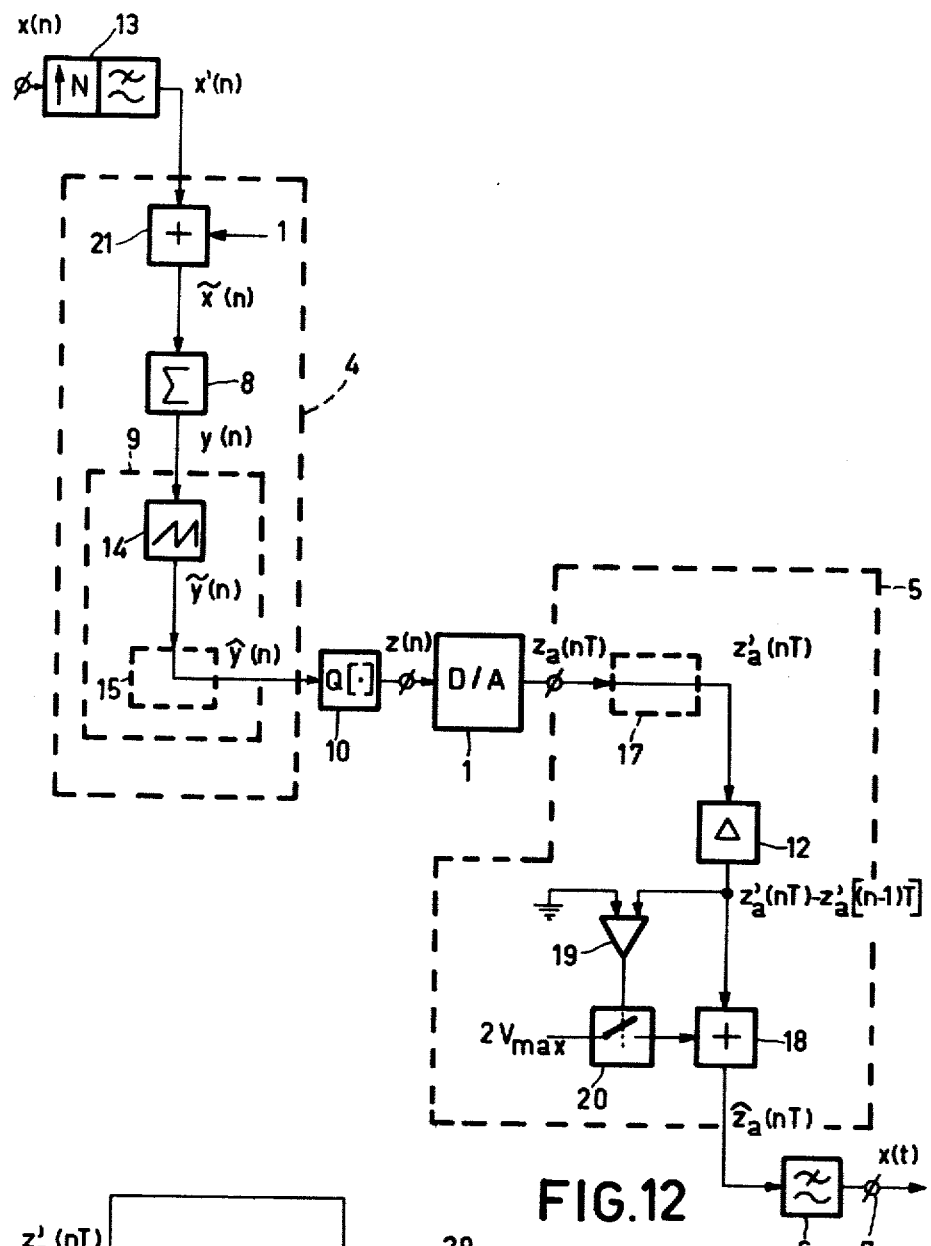
FIG. 12 shows a simplification of the digital-to-analog converter shown in FIG. 9.

FIG. 12 shows an embodiment based on the amplitude-limiting function defined in (48) and on the amplitude-restoration function defined in (49). For this embodiment it is further assumed that the signal applied to the integrating network 8 is always positive, so that the expressions (36), (37), (38) given in paragraph E(3) still hold. This arrangement of FIG. 12 differs from the arrangement shown in FIG. 9 in the following respects:

1. The pre-processing device 4 now does not produce numbers $k_n - k_{n-1}$ so that the signal source circuit 16 shown in FIG. 9 is no longer present in this arrangement of FIG. 12. The auxiliary limiter 15 is now formed by a direct through-connection.

2. The post-processing device 5 now comprises an auxiliary restorer 17 formed by a direct through-connection. In addition a polarity detector 19 is present which has its input connected to the output of the difference network 12. This polarity detector now produces, for example, a positive voltage of a certain reference level if the signal occurring at the output of the difference network 12 is positive. If, however, said signal is negative this polarity detector produces a negative voltage of a certain reference level. The output voltages of this polarity detector control a switch 20, shown symbolically only in the Figure, through which a reference voltage having a value of 0 Volt is applied to the adding device 18 each time the polarity detector produces a positive voltage, and a reference voltage of 2 $V_{max}$ Volts being applied to the adding device 18 via this switch each time polarity detector produces a negative voltage.

3. In order to ensure that the signal applied to the integrating network 8 is always positive for any random input signal $\{x(n)\}$ for which it holds that $-1 \leq x(n) \leq +1$ the pre-processing device comprises an adding device 21 to which the digital signal $\{x'(n)\}$ as well as a constant having the value $+1$ are applied. Thus, there occur at the output of this adding device the code words x(n) for which it holds that:

$$\bar{x}(n) = x'(n) + 1$$

with $-1 < x'(n) < +1$ so that $\bar{x}(n)$ is always positive.

E(5) Detailed embodiments of some components

E(5.1) The accumulator 8 and the auxiliary limiter 14

Figure 13:
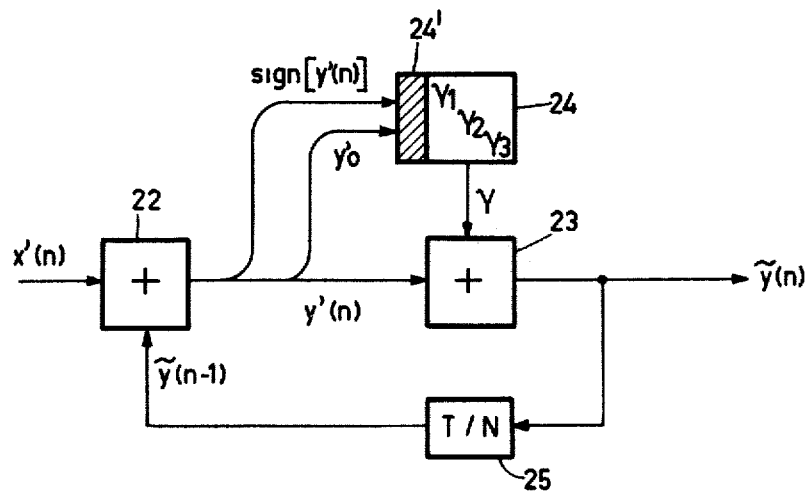
FIG. 13 shows an embodiment of the cascade arrangement of the integrating network and the auxiliary amplitude-limiter for use in the digital-to-analog converter of FIG. 9.

FIG. 13 shows in greater detail an embodiment of the cascade arrangement of the integrating network 8 and the auxiliary limiter 14 used in the arrangement shown in FIG. 9. Hereinafter the sign bit of a code-word $\phi$ will be denoted by sign ($\phi$) and it will be assumed that:

sign ($\phi$) = 0 when $\phi \geq 0$ sign ($\phi$) = 1 when $\phi < 0$

The embodiment shown in FIG. 13 of the above-mentioned cascade arrangement is formed by an adder 22 to which the (b+a)-bit code words x'(n) are applied through a first input and the code-words $\bar{y}(n-1)$ through a second input. This adder 22 is now arranged so that it produces code-words y'(n) for which it holds that: $y'(n) = x(n) + \bar{y}(n-1)$ and which have one bit more than x'(n). More particularly it holds that the most significant bit in x'(n) has the value $2^{-1}$, whereas the most significant bit in y'(n) has the value $2^0$. This code word y'(n) is now further applied to a second adder 23 to which also a (b+a+1)-bit auxiliary number $\gamma$ is applied and this sum number is now the desired number $\bar{y}(n)$. This number $\bar{y}(n)$ is not only applied to the auxiliary limiter 15 (see FIG. 9) but also to a delay device 25 having a time delay T/N. The output of the delay device 25 is connected to the second input of the adder 22.

The storage device 24 contains three numbers in base-2-code namely the numbers:

$$\gamma_1 = +(2 - 2^{-(b+a)})$$
$$\gamma_2 = -(2 - 2^{-(b+a)})$$
$$\gamma_3 = +0$$

which are each stored in a certain addressable storage location of this storage device. Through an address decoder 24' these storage locations are addressable by the sign bit sign [y'(n)] and the most significant bit of y'(n). If this most significant bit is represented by y'$_0$ then the storage device 24 produces more particularly the number:

$\gamma_1$ when y'$_0$ = 1 and sign [y'(n)] = 1
$\gamma_2$ when y'$_0$ = 1 and sign [y'(n)] = 0
$\gamma_3$ when y'$_0$ = 0

The cascade arrangement of the integrating network 8 and the auxiliary limiter 14 can be considerably simpler if this cascade arrangement is used in the arrangement shown in FIG. 12. As x(n) is always positive, so that $k_n$ need not be determined, the function of this cascade arrangement can be performed by a (b+a)-bit accumulator.

E(5.2) The signal source circuit

Figure 14:
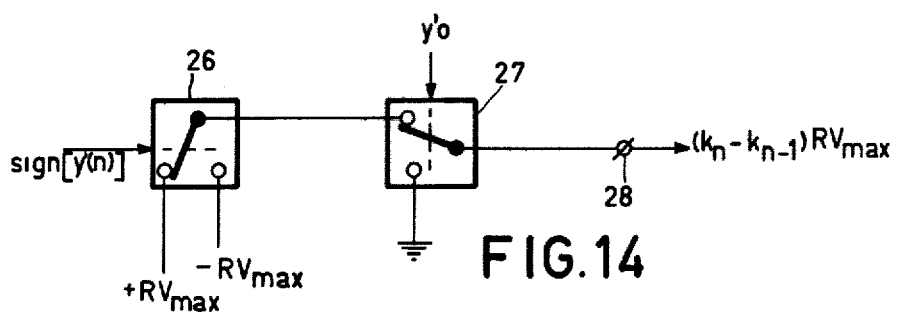
FIG. 14 shows an embodiment of a signal source circuit for use in the digital-to-analog converter of FIG. 9.

FIG. 14 shows a detailed embodiment of the signal source circuit 16, which is suitable for use in the arrangement shown in FIG. 9 and in conjunction with the embodiment shown in FIG. 13 of the cascade arrangement of integrating network 8 and auxiliary limiter 14. The signal source circuit shown in FIG. 14 comprises two switches 26 and 27, which are shown symbolically only. The switch 26 is controlled by the sign bit sign [y'(n)] of y'(n) and the switch 27 is controlled by the most significant bit y'$_0$ of y'(n). In addition, this signal source circuit comprises an output 28 which, in the arrangement of FIG. 9, is connected to an input of the adder 18.

The signal source circuit operates as follows: when y'$_0$ = 0 then the output 28 is connected to ground through the switch 27 and a voltage of 0 Volt is thus supplied to this output. If y'$_0$ = 1 then the output 28 is connected to the output of the switch 26 through the switch 27, a voltage of $+RV_{max}$ being applied to this output when sign [y'(n)] = 0, a voltage of $-RV_{max}$ being applied to this output when sign [y'(n)] = 1.

E(5.3) The difference network

Figure 15:
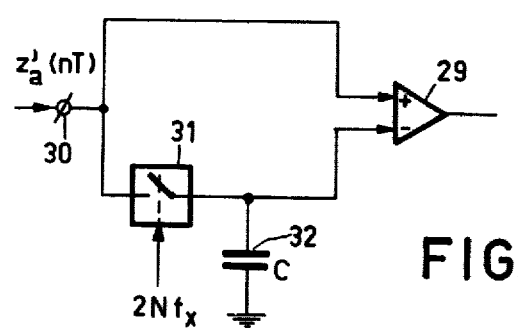
FIG. 15 shows an embodiment of a difference network.

FIG. 15 shows an embodiment of the difference network 12. This network comprises a differential amplifier 29 a first input of which is directly connected to the input 30 of the difference network to which the signal samples z'$_a$(nT) are applied. The second input of the differential amplifier 29 is also connected to the input 30, namely through a sample and hold circuit. In the Figure the sampling circuit is shown symbolically by the switch 31 and the hold circuit is shown symbolically by the capacitor 32. Sampling pulses are applied to the switch 31 with a frequency $2Nf_x$ and the instant at which the $n^{th}$ sampling pulse occurs is just prior to the moment $z'_a(nT)$ changes into $z'_a[(n+1)T]$.

E(6) Final remarks

1. In special circumstances it may be preferred to structure the difference network 12 in a different manner then shown in FIG. 15, namely by means of digital circuit components. In order to enable the use of such a difference network the D/A converter 1 must be arranged somewhere between the output of the difference network 12 and the output of the filter 6. If now more particularly this D/A converter 1 is connected to the output of the adder 18 then the elements 17, 12, 18 and 16 of the arrangement shown in FIG. 9 can all be implemented in digital techniques; the elements 12, 18, 19 and 20 of the arrangement shown in FIG. 12 can then be implemented in digital techniques.

2. In practice it appeared that, instead of a difference network it is alternatively possible to use a differentiating network, for example a simple RC-network in the post-processing device. It will be assumed that the term difference network also comprises the notion differentiating network.

Figure 16:
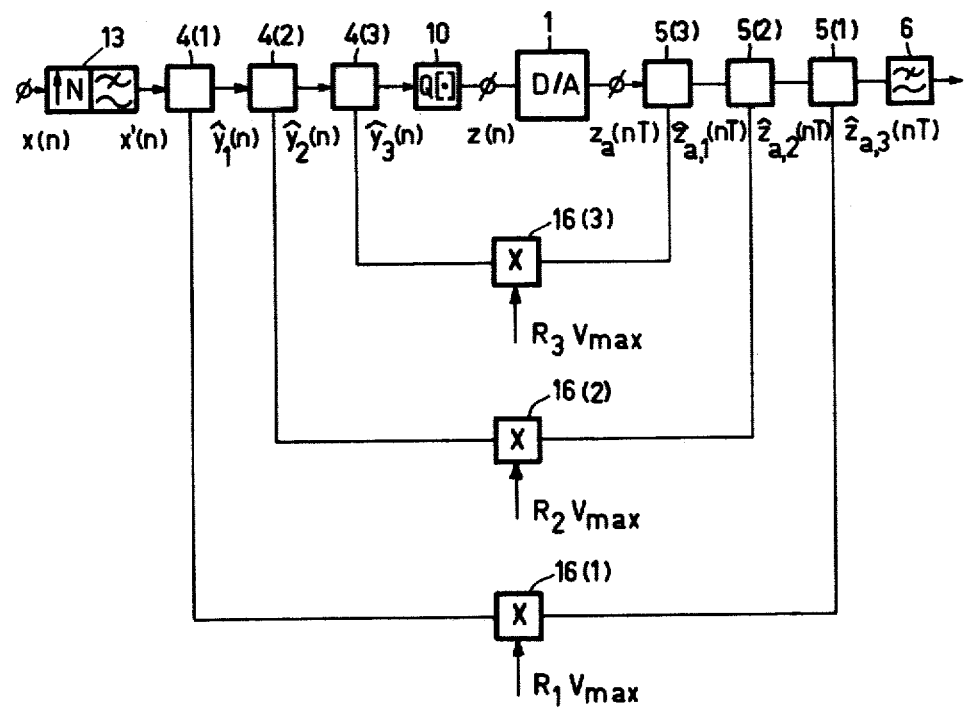
FIG. 16 shows a so-called nested version of the digital-to-analog converter shown in FIG. 9.

3. For the arrangements described in the foregoing it appeared that for a certain value of N the quantizing device 10 may suppress only a certain number of bits of the code words $\tilde{y}(n)$; for example not more than three. This means that if $x(n)$ is a 16-bit code-word a 13-bit D/A converter must then be used which may, however, still be relatively expensive. It is however, possible to suppress more bits than the above-mentioned three bits, the value of N remaining equal without a deterioration of the signal quantizing noise. This can be achieved with any one of the above-described arrangements, namely by "nesting" such an arrangement in known manner. For example, nesting the arrangement shown in FIG. 9 results in the arrangement shown in FIG. 16. In this arrangement shown in FIG. 16 the digital signal $\{x'(n)\}$, produced by the interpolator is applied to the quantizing device 10 through a cascade arrangement of M pre-processing devices 4(1), 4(2), ... 4(M). The output signal samples $z_a(nT)$ produced by the auxiliary D/A converter 1 are applied in their turn to the output filter 6 via a cascade arrangement of also M post-processing devices 5(1), 5(2), ... 5(M). In the arrangement shown in FIG. 16 M is equal to three. The three pre-processing devices 4(1), 4(2) and 4(3) are each implemented in the same manner as the pre-processing device shown in FIG. 9. Also each of the three post-processing devices 5(1), 5(2), 5(3) are implemented in the same manner as the post-processing device shown in FIG. 9.

4. In the embodiments shown the interpolator 13 is assumed to be constituted by a so-called SRI-element followed by a digital filter (see paragraph E(1.2)). However, in practice it appears that this digital filter is not a requirement; this is more particularly the case shown in the embodiment of FIG. 12. If an increase in the sampling frequency of the digital input signal is deemed necessary, a SRI-element might then be sufficient.

5. Each of the shown embodiments comprises an output filter 6. However, such a filter can be dispensed with in many applications.

What is claimed is:

1. A digital-to-analog converter for converting a digital signal, formed by a sequence of code-words, each having $b+a$ bits, into an analog signal, characterized in that this digital-to-analog converter comprises:

a converter input for receiving the digital signal;

a converter output;

means for integration and amplitude-limiting for producing a digital auxiliary signal which is an amplitude-limited version of the integrated digital signal applied to said means;

first coupling means for coupling the input of the integration and amplitude-limiting means to a converter input;

quantizing means connected to said integration and amplitude-limiting means for limiting the word length of the code words of the digital auxiliary signal for the generation of a quantizing means output signal formed by a sequence of code-words, each having b-bits;

difference and amplitude-restoration means;

second coupling means for coupling the input of the difference and amplitude-restoration means to the output of quantizing means;

third coupling means for coupling the output of the difference and amplitude-restoration means to the converter output;

a b-bit auxiliary digital-to-analog converter included in the circuit formed by the second coupling means, the difference and amplitude-restoration means and the third coupling means.

2. A digital-to-analog converter as claimed in claim 1, characterized in that the function which describes the relationship between the auxiliary signal produced by the integration and amplitude-limiting means and the integrated value of the signal applied to this means is a periodic function.

3. A digital-to-analog converter as claimed in claim 1, characterized in that the relationship between the digital auxiliary signal $\{y(n)\}$ produced by the integration and amplitude-limiting means and the digital signal $\{x'(n)\}$ of these means is given by the relation $$\tilde{y}(n) = \eta \left\{ \sum_{i=-\infty}^{n} x'(i) - k_n R \right\}$$

wherein:

$\eta$ and R each represent a random real and positive number n and i each represent an integral number wherein
$-\leq n < \infty$ and
$-\infty < i < \infty$ $k_n$ represents an integral and positive number and has such a value that $-A < \tilde{y}(n) < A$, wherein A is a suitable positive number.

4. A digital-to-analog converter as claimed in claim 3, characterized in that the integration and amplitude-limiting means comprise means for generating a digital signal which is representative of the difference $k_n - k_{n-1}$.

5. A digital-to-analog converter as claimed in claim 4, characterized in that it further comprises means for generating a signal which is representative of the product $(k_n - k_{n-1})RV_{max}$, $RV_{max}$ representing a constant reference signal, these means being coupled to said integration and amplitude-limiting means and to a second input of said adding means.

6. A digital-to-analog converter as claimed in claim 1, characterized in that said amplitude-restoration means are formed by an adding device which has a first input connected to the output of the difference means and its output connected to said third coupling means.

7. A digital-to-analog converter as claimed in claim 5, characterized in that the output of the difference means is also connected to a polarity detector circuit which controls a switching device through which either a first or a second reference signal of constant value is applied to a second input of the adding device in dependence on the polarity of the difference means output signal.

8. A digital-to-analog converter as claimed in claim 1, characterized in that said first coupling means comprise an adding device to which a reference code word is applied.

9. A digital-to-analog converter as claimed in claim 1, characterized in that said first coupling means comprise an interpolating digital filter.

* * * * *